United States Patent [19]

Amantea et al.

[11] 4,388,634

[45] Jun. 14, 1983

[54] TRANSISTOR WITH IMPROVED SECOND BREAKDOWN CAPABILITY

[75] Inventors: Robert Amantea, Griggstown, N.J.; Carl F. Wheatley, Jr., Drums, Pa.

[73] Assignee: RCA Corporation, New York, N.Y.

[21] Appl. No.: 212,813

[22] Filed: Dec. 4, 1980

[51] Int. Cl.³ ............................................. H01L 29/72
[52] U.S. Cl. .......................................... 357/34; 357/89
[58] Field of Search ...................................... 357/34, 89

[56] References Cited

U.S. PATENT DOCUMENTS

| | | | |
|---|---|---|---|
| 2,813,817 | 11/1957 | Leverenz | 357/34 |
| 3,338,758 | 8/1967 | Tremere | 357/34 |
| 3,510,736 | 5/1970 | Dingwall | 357/89 |
| 3,916,431 | 10/1975 | Khajezadeh | 357/89 |
| 3,977,020 | 8/1976 | Enzlin et al. | 357/51 |
| 4,032,956 | 6/1977 | Yagi et al. | 357/34 |
| 4,151,541 | 4/1979 | Roger | 357/34 |
| 4,345,266 | 8/1982 | Owyang | 357/34 |

FOREIGN PATENT DOCUMENTS 2026236 1/1980 United Kingdom .

*Primary Examiner*—Gene M. Munson
*Attorney, Agent, or Firm*—Birgit E. Morris; Donald S. Cohen; Robert P. Seitter

[57] ABSTRACT

A transistor having increased reverse second breakdown capabilities includes a collector formed with a high resistivity region including a channel portion adjacent the central portion of the emitter and with a lower resistivity region forming an interface around said channel portion. The second region is arranged to include a portion located laterally inwardly of the outer edges of the emitter so that a preferential current path is provided that defocuses the minority carriers injected by the emitter during the time the transistor is being switched off.

2 Claims, 2 Drawing Figures

TRANSISTOR WITH IMPROVED SECOND BREAKDOWN CAPABILITY

BACKGROUND OF THE INVENTION

This invention relates to transistors and, more particularly, to bipolar transistors having improved reversed second breakdown capabilities.

Reverse second breakdown can occur while the transistor is being switched off. During switch off, the majority carriers in the base flow laterally from beneath the emitter to the base electrode causing a lateral voltage drop that turns off the outer edge portions of the emitter, but leaves the central portion thereof on. That is, the central portion of the emitter still injects minority carriers. Any stray or load inductance in the circuit connected to the collector forces the collector current to remain constant so that the central portion of the emitter injects more and more minority carriers. Accordingly, the current density under the central portion of the emitter increases to provide the constant current. This high current density causes base widening in the central region under the emitter which, in turn, changes the electric field distribution so that the peak field increases and is located at the N+N interface of the collector. If the peak field becomes sufficiently high, the current and voltage experience avalanche multiplication causing regeneration, excessive heating and finally catastrophic destruction of the transistor.

One attempt to increase the reverse second breakdown capability of transistors is disclosed in British Patent Application No. 2,026,236A published Jan. 30, 1980. In accordance with this publication, an attempt is made to decrease the current density under the central portion of the emitter when the transistor is being switched off. This is accomplished by forming the emitter with a central portion having a lower gain than the outer edge portions thereof. Various techniques are disclosed for providing such an emitter. The problem with this approach is that considerable emitter injecting area is lost which leads to a loss in the saturation voltage and maximum current handling capability of the transistor.

SUMMARY OF THE INVENTION

In accordance with this invention there is provided a mechanism for effectively reducing the current density under the emitter when a transistor is switched off. This is accomplished by defocusing the current injected by the emitter during switch off without subtracting from the emitter area. With this arrangement, improved reverse second breakdown capability is provided with only minimal, if any, adverse impact on saturation voltage and current handling capability of the transistor.

A transistor in accordance with this invention comprises an emitter of a first conductivity type, a base of a second conductivity type and a collector also of the first conductivity type. The emitter and base form a first junction adjacent a first surface of the device and the base and collector form a second junction adjacent a second surface of the device. The collector includes a first region of relatively high resistivity material including a channel portion extending toward the second surface adjacent the central portion of the emitter. The collector further includes a second region of lower resistivity material forming an interface with the higher resistivity material of the first region, the interface includes a first portion extending around the channel portion. The first interface portion is located laterally inwardly of the outer edges of the emitter.

Preferably, the interface includes a second portion located adjacent the second junction and the first interface portion extends downwardly toward the second surface from an intersection formed with the second interface portion. The intersection thus formed is also located laterally inwardly of the outer edges of the emitter.

With this arrangement, the current injected from the emitter to the collector during switch off of the transistor is defocused since the minority carriers injected by the emitter flow toward the lower resistivity regions adjacent the first interface portions and are thus spread over a larger area.

BRIEF DESCRIPTION OF THE DRAWING

For a better understanding of the invention, reference is made to the following description of several preferred embodiments thereof, taken in conjunction with the figures of the accompanying drawing, in which.

DETAILED DESCRIPTION OF THE PREFERRED EMBODIMENT

Figure 1:
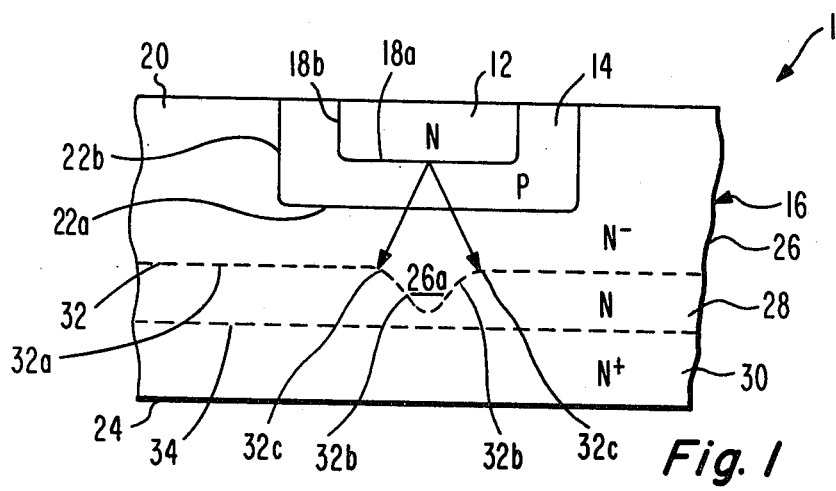
FIG. 1 is a sectional view through a portion of a transistor in accordance with a preferred embodiment of this invention.

Referring now to the drawing, FIG. 1 discloses a first embodiment of the invention in the form of an NPN transistor formed in a chip 10 of semiconductor material such as silicon. Included is an N type emitter 12, a P type base 14 and an N type collector designated generally at 16. Between the emitter 12 and base 14 is formed a first PN junction including a portion 18a parallel to and slightly spaced from a first, top as viewed in the drawing, surface 20 of chip 10. Between the base 14 and the collector 16 is formed a second PN junction including a portion 22a generally parallel to and spaced from a second, bottom as viewed in the drawing, surface 24 of the transistor 10. The portion 22a of the second PN junction is between the portion 18a of the first such junction and the second surface 24. In this embodiment of the invention, the above noted junctions also include portions 18b and 22b that are normal to and terminate in the top surface 20 of the chip 10. It should be understood that the transistor could include a conventional mesa structure in which case junction portion 22b would be elminated.

The geometry of the transistor, that is, its top surface configuration could be any suitable type. For example, the emitter could be in the form of a closed dot, circular or polygonal, surrounded by a similarly shaped base, the emitter could be a series of stripes, or could be a set of fingers interdigitated with finger portions of the base. The particular geometry used is a matter of choice, although the closed dot may be preferred to enhance defocusing as will be clearly explained hereinafter. As is conventional, the emitter 12, base 14 and collector 16 are associated with suitable electrodes, not shown in the drawing for the sake of clarity. It should also be understood that the transistor could be the PNP type in which case, the conductivity types noted above would be reversed.

The collector 16 includes a first region of relatively high resistivity material, for example, N− type, a second region of lower resistivity material, for example, N type, and a third region of lowest resistivity material, for example, N+ type. The N− region 26 extends inwardly from the top surface 20 laterally adjacent the base 14 and also inwardly from beneath the base where it forms an interface 32 with the N region 28; the N+ region extends inwardly from the bottom surface 24 where it also forms an interface 34 with the N region 28. The interface 34 is a plane generally parallel to the bottom surface 24 as is conventional in the art.

In order to defocus the current during the switch off time, the interface 32 between the N− region 26 and the N region 28 is formed with a depression directly adjacent the central portion of the emitter 12. This depression provides an N− channel portion 26a extending into the N region 28 toward the bottom surface 24 directly adjacent the central portion of the emitter 12. In some embodiments, the channel portion 26a could terminate at the interface 34. In the preferred embodiment, however, due to manufacturing techniques, the channel portion 26a terminates at a point spaced above the interface 34 as shown in FIG. 1.

It can be seen that the interface 32 includes a generally planar portion 32a extending generally parallel to the portions 18a and 22a of the junctions noted above. The interface 32 further includes an inclined portion 32b extending downwardly from the portion 32a and this inclined portion surrounds the channel portion 26a. The interface portions 32a and 32b form an intersection 32c in the form of a line, the shape of which varies depending on the shape of the emitter 12. For example, if the emitter 12 is a closed dot, the intersection 32c is a generally circular line and the interface portion 32b is an inverted, generally conical surface; if the emitter is an elongated stripe, the intersection 32c is a generally oval line and the interface portion 32b defines a through-like configuration of inverted V-shape in a cross-section along its axis. The inclined interface portion 32b and the intersection 32c are located laterally inwardly of the edges of the emitter 12, that is, laterally inwardly of the junction portions 18b. In some instances, however, the intersection 32c could be located laterally outwardly of the edge of the emitter 12, but this may adversely affect the forward bias operation of the transistor.

As the transistor 10 is switched off, the minority carriers (electrons in the preferred embodiment) injected by the emitter 12 are injected from the central portion thereof. As these carriers cross into the N− region 26, they are attracted to the lower resistivity region 28 adjacent the inclined interface portion 32b and to the intersection 32c as illustrated by the arrows in the drawing. Thus, the current density is reduced since the current is distributed over an area encompassed by the intersection 32c. The current is, in effect, defocused and the peak electric field in the collector is reduced so that the reverse second breakdown capability of the transistor is increased.

The transistor can be readily manufactured by starting with a heavily doped N+ wafer that forms the N+ region 30 of the collector 16. Thereafter, a lower concentration of N type atoms is deposited on one surface of the N+ wafer at spaced apart locations on either side of the area where the channel 26a is to be formed. The N− region 26 is epitaxially grown on the N+ wafer and this epitaxial growth will simultaneously cause the N type atoms on the wafer to diffuse both laterally and vertically into the epitaxial layer to form the region 28 and the channel portion 26a. Finally, the P type base and N type emitter are diffused into the epitaxial layer in accordance with generally conventional techniques.

Figure 2:
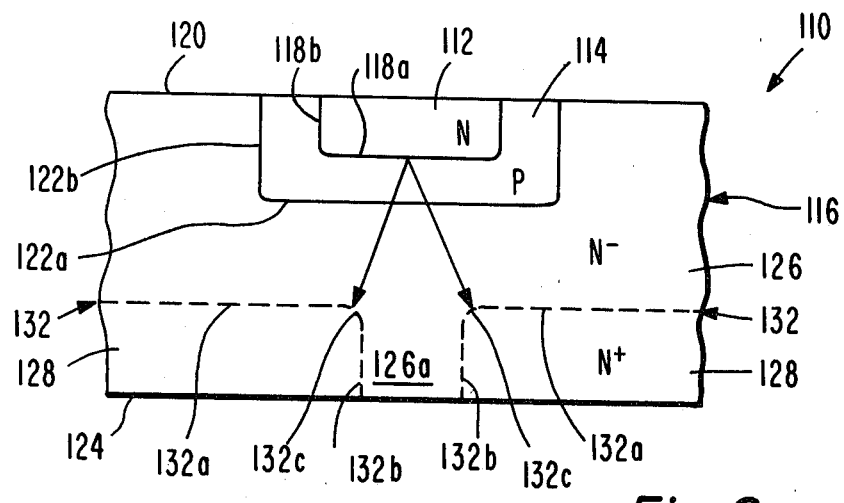
FIG. 2 is a similar cross-sectional view of a portion of a transistor in accordance with another preferred embodiment of this invention.

Referring next to FIG. 2 of the drawing, there is illustrated another preferred embodiment of an NPN transistor in accordance with this invention. Since most portions of the transistor are similar to the transistor of FIG. 1, like reference numerals added to 100 will be utilized in the following description. This transistor is formed on a chip 110 of semiconductor material and includes an N type emitter 112, a P type base 114 and an N type collector denoted generally at 116. The emitter 112 and base 114 form a junction including portions 118a generally parallel to and portions 118b generally perpendicular to a first surface 120 of the transistor; the base 114 and collector 116 form a junction including portions 122a generally parallel to and portions 122b generally perpendicular to that surface. A second or bottom surface 124 is, of course, also provided and the portion 122a is between the portion 118a and the second surface.

In this embodiment, the collector region 116 includes a first region 126 of relatively high resistivity material, for example, N− type, and a second region 128 of lower resistivity material, for example, N+ type. The N− region 126 extends inwardly from the top surface 120 adjacent the base 114 and also inwardly from beneath the base where it forms an interface 132 with the N+ region 128; the N+ region 128 extends inwardly from the bottom surface 124 to the interface.

In order to defocus the current during switch off time, the interface 132 is formed with a generally cylindrical depression forming a channel portion 126a extending directly adjacent the central portion of the emitter 112. The channel portion 126a extends into the region 128 and terminates at the second surface 124 of the transistor. It should be understood, however, that the region 128 could be an N region formed on an N+ substrate region extending inwardly from and across the entire surface 124. With such an arrangement, the N region would terminate at an interface with the N+ region.

It can be seen that the interface 132 includes a generally planar portion 132a extending generally parallel to the portions 118a and 122a of the junctions noted above. Extending downwardly from the portion 132a toward the bottom surface 124, the interface includes a portion 132b generally perpendicular to the surface 124 that forms an intersection 132c with the portion 132a. The configuration of the intersection 132c and of the portions 132 varies with the shape of the emitter 112 as explained with respect to the embodiment of FIG. 1. The downwardly extending portion 132b and the intersection 132c are located laterally inwardly of the edges of the emitter 112, that is, laterally inwardly of the junction portions 118b. Thus, there is provided beneath the emitter, a collector portion 126a of relatively high resistivity material and a collector portion 128 of lower resistivity material.

In a manner similar to the transistor of FIG. 1, as this transistor is switched off, the minority carriers injected by the emitter 112 are injected from the central portion thereof. As these carriers cross into the N− region 126 they are attracted to the lower resistivity region 128 adjacent the second interface portion 132b and also to the intersection 132c as illustrated by the arrows in the drawing. As noted, this defocuses the current by spreading the current over an area encompassed by the intersection 132c whereby the reverse second breakdown capability of the transistor 110 is increased.

The transistor 110 of FIG. 2, can be formed by a conventional triple diffusion technique. In order to make the semiconductor, a suitably masked N− wafer is first diffused with a heavy concentration of N type atoms to form the N+ region 128. Then, the P type base region 114 is diffused into the opposite surface of the wafer and, thereafter, the N type emitter 112 is diffused into the same opposite surface.

It should be clear that, in addition to improving the reverse second breakdown capabilities of the transistor, this invention does not otherwise materially alter the operation thereof. The emitter area is left intact and during forward bias operation, the emitter injects in its normal manner with the heaviest current density at its edges and its smallest current density at its central portion. Because the emitter areas are left intact, the saturation voltage and the maximum current handling of the capability of the transistor is not significantly reduced.

While in the foregoing there have been described two preferred embodiments of the invention, it should be understood by those skilled in the art that various changes and modifications can be made without departing from the true spirit and scope of the invention as recited in the appended claims.

We claim:

1. A transistor comprising an emitter of a first conductivity type, a base of a second conductivity type and a collector of said first conductivity type, said emitter and said base forming a first junction adjacent a first surface of said transistor, and said base and said collector forming a second junction between said first junction and a second surface of said transistor, said collector including (a) a first region of relatively high resistivity material including a channel portion extending toward said second surface adjacent the central portion of said emitter, (b) a second region of lower resistivity material forming a first interface with the higher resistivity material of said first region, said first interface including a first portion extending around said channel portion, said first portion being located laterally inwardly of the outer edges of said emitter, and (c) a third region of lowest resistivity material extending from said second surface toward said second junction, said second region and said third region forming a second interface between said first interface and said second surface and wherein said channel portion terminates adjacent said second interface.

2. A transistor in accordance with claim 1 wherein said first interface includes a second portion which intersects said first portion and extends generally parallel to said first and second junctions, and wherein said first portion extends downwardly at an incline toward said second surface from the intersection with said second portion.

* * * * *

UNITED STATES PATENT AND TRADEMARK OFFICE
CERTIFICATE OF CORRECTION

PATENT NO. : 4,388,634

DATED : June 14, 1983

INVENTOR(S) : Robert Amantea et al.

It is certified that error appears in the above-identified patent and that said Letters Patent is hereby corrected as shown below:

Column 1, line 7: delete "reversed" and substitute -- reverse -- therefor.

Column 3, line 39: delete "through" and substitute -- trough -- therefor.

Signed and Sealed this

Thirteenth Day of September 1983

[SEAL]

Attest:

GERALD J. MOSSINGHOFF

*Attesting Officer*   *Commissioner of Patents and Trademarks*